(12) United States Patent
Lee et al.

(10) Patent No.: US 8,594,175 B2
(45) Date of Patent: Nov. 26, 2013

(54) METHOD FOR MODULATING AND DEMODULATING DATA

(75) Inventors: Hyung Soo Lee, Daejeon (KR); Jaehwan Kim, Daejeon (KR); Jae Young Kim, Daejeon (KR); Jae Ho Hwang, Incheon (KR); Jae Moung Kim, Incheon (KR); Sung Jeen Jang, Incheon (KR); Nack Hyun Choi, Incheon (KR); Jong Seok Park, Incheon (KR)

(73) Assignees: Electronics and Telecommunications Research Institute, Daejeon (KR); Inha-Industry Partnership Institute, Icheon (KR)

( * ) Notice: Subject to any disclaimer, the term of this patent is extended or adjusted under 35 U.S.C. 154(b) by 697 days.

(21) Appl. No.: 12/607,243

(22) Filed: Oct. 28, 2009

(65) Prior Publication Data

US 2010/0124269 A1    May 20, 2010

(30) Foreign Application Priority Data

Nov. 18, 2008    (KR) ........................ 10-2008-0114871

(51) Int. Cl.
*H03K 7/04* (2006.01)

(52) U.S. Cl.
USPC ........... 375/239; 375/237; 375/286; 375/359; 375/361

(58) Field of Classification Search
USPC ......... 375/239, 237, 241, 242, 286, 359, 361; 455/23
See application file for complete search history.

(56) References Cited

U.S. PATENT DOCUMENTS

| | | | |
|---|---|---|---|
| 7,289,560 B2 * | 10/2007 | Huat | 375/239 |
| 8,081,882 B2 | 12/2011 | Tuchler | |
| 2006/0268959 A1 * | 11/2006 | Kim et al. | 375/130 |
| 2007/0121571 A1 * | 5/2007 | Doberstein et al. | 370/350 |
| 2009/0091400 A1 * | 4/2009 | Orlik et al. | 332/103 |
| 2009/0306976 A1 * | 12/2009 | Joetten et al. | 704/214 |

FOREIGN PATENT DOCUMENTS

| | | |
|---|---|---|
| JP | 2008-193701 A | 8/2008 |
| KR | 1020040072868 A | 8/2004 |
| KR | 10-0623065 B1 | 9/2006 |
| KR | 10-0623384 B1 | 9/2006 |

OTHER PUBLICATIONS

Jae Ho Hwang, et al; "Group PPM method to 802.15TG6", IEEE P802.15-09-0137-02-0006, Mar. 6, 2009, pp. 1-22.

* cited by examiner

*Primary Examiner* — Qutbuddin Ghulamali
(74) *Attorney, Agent, or Firm* — Ladas & Parry LLP

(57) ABSTRACT

Disclosed is a method for modulating and demodulating data. The method composes symbols by grouping a plurality of symbols for pulse position modulation to newly add symbol compositions to fixed symbols used for the pulse position modulation of the related art. Further, the method uses grouped symbols to improve data transmission rate as the average amount of information increases.

10 Claims, 9 Drawing Sheets

METHOD FOR MODULATING AND DEMODULATING DATA

CROSS-REFERENCE TO RELATED APPLICATION

This application claims priority to and the benefit of Korean Patent Application No. 10-2008-0114871 filed in the Korean Intellectual Property Office on Nov. 18, 2008, the entire contents of which are incorporated herein by reference.

BACKGROUND OF THE INVENTION (a) Field of the Invention

The present invention relates to a method for modulating and demodulating data. Particularly, the present invention relates to a method for modulating data using a pulse position modulation (PPM), and a method for demodulating data modulated by the PPM method in an ultra wideband system.

(b) Description of the Related Art

Generally, an ultra wideband (hereinafter, referred to as "UWB") system occupies a wide frequency bandwidth compared to a narrowband system or a wideband system of the related art. In general, the UWB system means a system that occupies 20% of a central frequency bandwidth or occupies a frequency bandwidth of 500 MHz or more. In order to occupy a wide frequency bandwidth, the UWB system should use a very short pulse in terms of time. Therefore, when the UWB system uses the pulse for communication, it can transmit a signal at a low power due to a low duty cycle and has strong characteristics against multipath noise.

Meanwhile, the UWB system can use several modulation/demodulation manners to transmit the signal using the pulse. As the modulation/demodulation manners, there are a pulse amplitude modulation (PAM) manner that carries a signal on an amplitude of a pulse and then transmits the signal, an on off keying (OOK) manner that transmits a signal according to the existence and non-existence of a pulse, a pulse shape modulation (PSM) manner that transmits a signal using different pulses, and a pulse position modulation (hereinafter, referred to as "PPM") manner that transmits a signal using a position of a pulse.

The UWB system generally uses the PPM method having a low data transmission rate in short range communication. When using the PPM method, the UWB system can include a small number of hardware resources and uses a large number of pulses in order to transmit one bit of information. Further, the UWB system has an advantage in easily changing data transmission rate by changing a modulation/demodulation order or a frame length according to user's needs However, when increasing the modulation/demodulation order to increase the data transmission rate, since the data transmission rate is increased but intervals between the pulses having information is reduced, interference may be generated by noises in multiple paths, and a signal to noise ratio (SNR) is reduced. As a result, error probability is increased to degrade the reliability of data, and characteristics such as the acquisition of a processing gain are reduced to degrade the performance In addition, when increasing the modulation/demodulation order or reducing the length of the frame, the interval between the pulses is reduced to increase error, and particularly, inter symbol interference (ISI) is easily generated due to a multi-path delay.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method for modulating and demodulating data using PPM having advantages of increasing data transmission rate while reducing error occurrence.

In order to achieve the above object, an exemplary embodiment of the present invention provides a method for modulating data using a pulse position modulation manner by a transmitter, including:

reading symbol compositions mapped to input data from a symbol mapping table that includes symbol compositions represented by a plurality of grouped symbols; and modulating the data using the mapped symbol compositions, wherein the symbol mapping table includes a first symbol composition group including symbol compositions that are composed of a plurality of symbols having burst pulses positioned in all pulse periods.

Further, another embodiment of the present invention provides a method for modulating data using a pulse position modulation manner by a transmitter, including:

determining pulse positions of each of a plurality of grouped symbols corresponding to each of remaining bits other than a first bit of the input data bits; positioning burst pulses in all the pulse periods of one of a first symbol and a second symbol among the plurality of grouped symbols according to a value of a second bit of the input data when the first bit is a second value; and determining pulse positions of the remaining symbols other than the symbol having burst pulses are positioned in all the pulse periods among the plurality of grouped symbols according to the values of the remaining bits other than the first bit and the second bit of the input data bits.

In addition, yet another embodiment of the present invention provides a method for demodulating data modulated using a pulse position modulation method by a receiver, including:

measuring energy of a plurality of input symbols; determining the value of the first bit according to whether the energy of a first symbol and a second symbol of the plurality of symbols is the same; when the value of the first bit is determined to be a first value, determining the values of the remaining bits other than the first bit according to pulse positions of each of the plurality of symbols; when the value of the first bit is determined to be a second value different from the first value, determining a value of a second bit by comparing the energy of the first symbol and the second symbol; and when the value of the second bit is determined, determining the values of the remaining bits other than the first bit and the second bit according to the pulse positions of the remaining symbols other than one having large energy of the first symbol and the second symbol among the plurality of symbols.

DETAILED DESCRIPTION OF THE EMBODIMENTS

Figure 1:
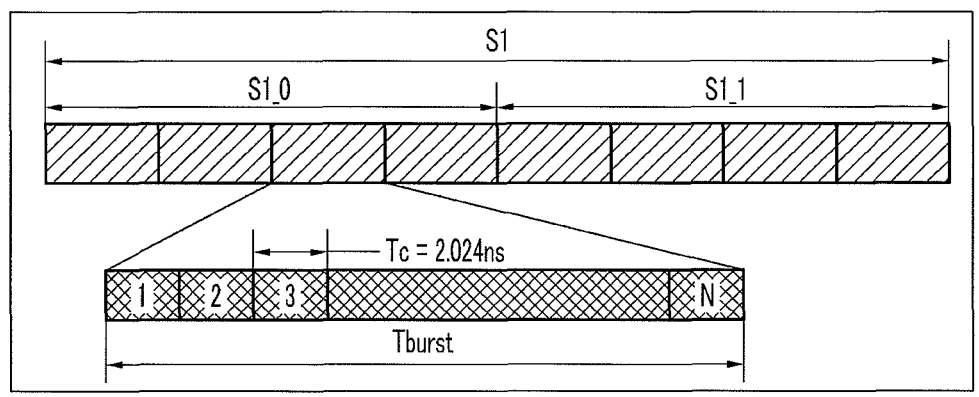
FIG. 1 is a configuration diagram showing a data frame in a general UWB system.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

Hereinafter, a method for modulating and demodulating data in an UWB system according to an exemplary embodiment of the present invention and particularly, a method for modulating and demodulating data using a PPM method will be described in detail with reference to the accompanying drawings.

Next, referring to FIGS. 1 to 3, a general PPM method will be described.

FIG. 1 is a structural diagram showing a data frame in a general UWB system, and shows a case of using a 2PPM method by way of example. In addition, FIG. 2 shows the number of cases of data that can be represented by one data frame when using a general 2PPM method, and FIG. 3 shows the number of cases of data that can be represented by one data frame when using a general 4PPM method. Herein, the number of cases of data means the number of cases of representable symbols.

Referring to FIG. 1, one data frame includes one symbol S1, and one symbol is composed of two pulse periods S1_0 and S1_1. Further, one pulse period is divided into four hopping periods in order to minimize interference between users that use the same frequency, wherein one hopping period is divided into N chips. Moreover, one pulse may be positioned in one chip.

In the following Equation 1, a transmission signal ($x^{(k)}(t)$) modulated by a general 2PPM method is a transmission signal corresponding to a k-th user.

$$x^{(k)}(t) = \sum_{i=1}^{N_{burst}} g_1^{(k)} S_j p\left(t - g_1^{(k)} T_{PPM} - jT_c - h^{(k)} T_{burst}\right) \quad \text{[Equation 1]}$$

Herein, $g_0^{(k)}$ carries a signal to be transmitted on phase information and then transmits the signal, and when $g_0^{(k)}$ is 1, a pulse of a positive phase is transmitted, and when $g_0^{(k)}$ is −1, a pulse of an inverse phase is transmitted. In addition, $S_j$ is a pseudo random binary sequence generated by a scrambler, and makes a sequence random. Further, $T_{burst}$ indicates one burst period, and $T_c$ represents one chip period included in the hopping period. Moreover, $h^{(k)}$ is a hopping code that defines a position by a burst position hopping within $T_{burst}$, and a plurality of users use an unique hopping code within one frame in a multiple access system to implement multiple access in a manner occupying different slots. In addition, $T_{PPM}$ is an occupied time of the PPM period, and when $T_{PPM}$ is 0, a pulse is positioned in a preceding frame, and when $T_{PPM}$ is 1, a pulse is positioned in a subsequent frame.

Figure 2:
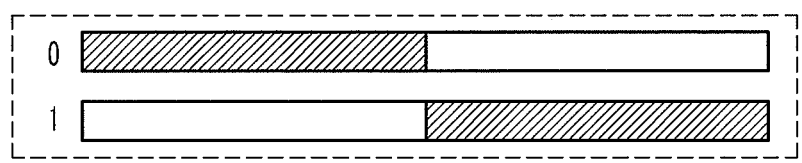
FIG. 2 shows the number of cases of data that can be represented by one data frame when using a general 2PPM method.

Referring to FIG. 2, when using the 2PPM method, there are two kinds of symbols that can be transmitted in one data frame. In other words, the number of cases of data that can be transmitted in one data frame is 2.

In the case of the 2PPM method, one data frame includes one symbol, and one symbol is composed of two pulse periods. Also, when data is 0, a consecutive burst pulse is positioned in a preceding pulse period of a symbol, and when data is 1, a consecutive burst pulse is positioned in a subsequent pulse period of a symbol such that it is possible to use two symbols for data transmission.

The following Equation 2 represents an average amount of information (entropy) of the data frame in the case of using the 2PPM method.

$$H_{2PPM} = \sum P_i l_i = \sum P_i \log 2(1/P_i) = 2 \times \frac{1}{2} \log 2(2) = 1 \quad \text{[Equation 2]}$$

Herein, $P_i$ represents the probability that the signal will be generated, and in Equation 2, $P_i$ is ½ due to uncertainty. Moreover, $L_i$ represents an information function of a symbol.

Figure 3:
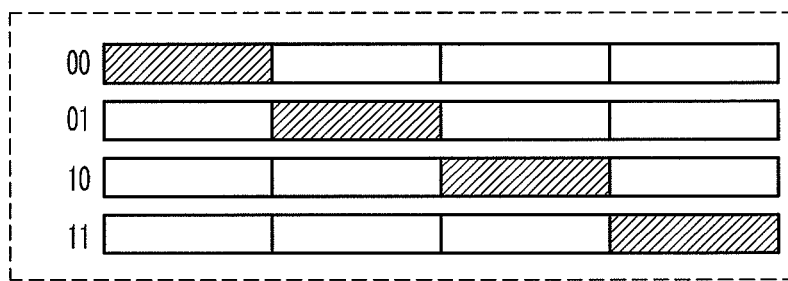
FIG. 3 shows the number of cases of data that can be represented by one data frame when using a general 4PPM method.

Referring to FIG. 3, in the case of using the 4PPM method, there are four kinds of symbols that can be transmitted in one data frame. In other words, the number of cases of data that can be transmitted in one data frame is four.

In the 4PPM method, one data frame includes one symbol, and one symbol is composed of four pulse periods. As with the 2PPM method, the 4PPM method positions the burst pulse in one of four pulse periods according to data such that it can use four symbols for data transmission.

The following Equation 3 represents an average amount of information of a data frame when using the 4PPM method.

$$H_{4PPM} = \sum P_i l_i = \sum P_i \log 2(1/P_i) = 4 \times \frac{1}{4} \log 2(4) = 2 \quad \text{[Equation 3]}$$

As in Equations 2 and 3, the case of using the 4PPM method can transmit an amount of information that is twice as large as the case of using the 2PPM method in the same frequency bandwidth. However, when the frame length used in both manners is the same, the one symbol length having the same length is divided into more pulse periods in the case of the 4PPM method, such that the signal period including energy is reduced by half and a decision period for demodulation is also reduced by half, thereby increasing error. In particular, the error occurrence probability is increased due to the multipath effect.

Figure 4:
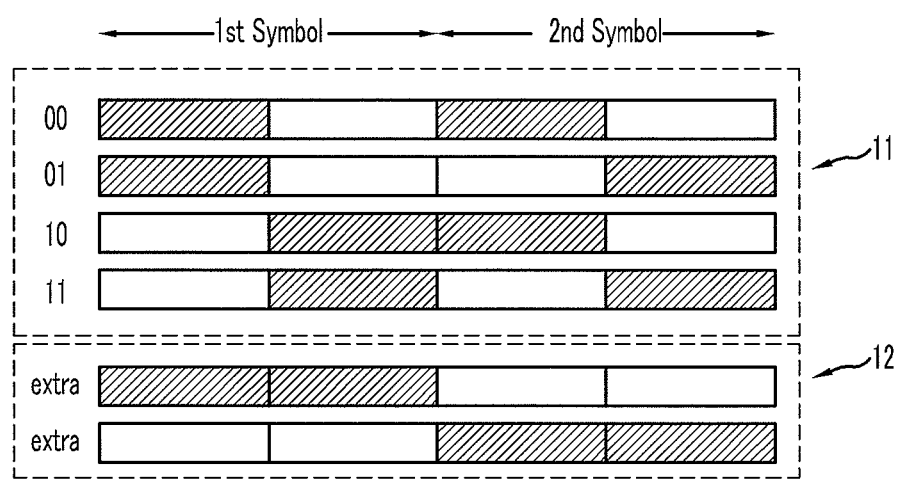
FIG. 4 shows the number of cases of symbol compositions that can be represented by a plurality of grouped symbols when using a group PPM method according to an exemplary embodiment of the present invention.

FIG. 4 shows the number of cases of symbol compositions that can be represented by the plurality of grouped symbols when using the group PPM method according to an exemplary embodiment of the present invention, and shows, by way of example, the case where two symbols composed of two pulse periods are grouped into one group.

Referring to FIG. 4, two data frames are grouped such that two symbols are grouped into one symbol group, and one symbol is composed of two pulse periods.

In the case of the 2PPM method of the related art, when data are transmitted using two symbols included in two data frames, one symbol can transmit one bit, such that the 2PPM method can transmit 2 bits of data in total. Also, the average amount of information that can be transmitted using two symbols is defined by the following Equation 4.

$$H_{2\times 2PPM} = \sum P_{2\times 2PPM} \log 2(1/P_{2\times 2PPM}) = 4 \times \frac{1}{4}\log 2(4) = 2 \quad \text{[Equation 4]}$$

However, as proposed in the exemplary embodiment of the present invention, when two symbols are grouped and used, as shown in FIG. 4, the number of cases of the symbol compositions that can be represented by the plurality of grouped symbols is six. In other words, the number of cases of data that can be transmitted by the plurality of grouped symbols is six. In this case, the average amount of information that can be transmitted by the plurality of grouped symbols is defined by the following Equation 5.

$$H_{2\times 2groupPPM} = \sum P_{2\times 2groupPPM} \log 2(1/P_{2\times 2groupPPM}) = 6 \times \frac{1}{6}\log 2(6) = 2.634 \quad \text{[Equation 5]}$$

As represented by Equation 5, when two symbols are grouped and used, it is shown that the average amount of information is larger than that of the case of transmitting data using two symbols according to the 2PPM method of the related art.

Meanwhile, although the foregoing exemplary embodiment describes by way of example the case of increasing the average amount of information by grouping two symbols, it is possible to group more than two symbols in the present invention Equation 6 represents the number of cases of the symbol compositions that can be represented by the plurality of grouped symbols according to the number of grouped symbols, that is, the number of cases of representable data.

$$P_n = \binom{2\times n}{n} = \frac{2n\times(2n-1)\times\ldots\times(n-1)}{n\times\ldots\times 2\times 1} \quad \text{[Equation 6]}$$

Table 1 shows the results of comparing the number of cases of representable data that can be represented by the predetermined number of symbols and the average amount of information in the case of using the group PPM method according to the exemplary embodiment of the present invention with those in the case of using the PPM method of the related art, based on the foregoing Equation 6.

TABLE 1

Comparison of number of cases and average amount of information

| | PPM | | Group PPM | |
|---|---|---|---|---|
| Number of groups | Number of cases | Average amount of information (Entropy) | Number of cases | Average amount of information (Entropy) |
| 1 | 2 | 1 | 2 | 1 |
| 2 | 4 | 2 | 6 | 2.5849 |
| 3 | 8 | 3 | 20 | 4.3219 |
| 4 | 16 | 4 | 70 | 6.1292 |
| 5 | 32 | 5 | 252 | 7.9772 |

It is shown from Table 1 that the case of using the group PPM method according to the exemplary embodiment of the present invention increases the number of cases of representable data and the average amount of information, compared to the case of transmitting the same number of symbols using the PPM method of the related art.

Meanwhile, as described above, a new modulation/demodulation method is required to improve data transmission rate as the average amount of information is increased, and then the embodiment of the present invention provides it.

Next, the method for modulating and demodulating data using the group PPM method according to the exemplary embodiment of the present invention will be described with reference to FIGS. 5 to 8.

Meanwhile, although the case of performing the modulation by grouping three symbols is described by way of example, the present invention is not limited thereto, and can be applied to a case of using the plurality of grouped symbols. In addition, although the exemplary embodiment of the present invention describes by way of example the case where one symbol is composed of two pulse periods, the present invention can use a symbol composed of more than two pulse periods. In other words, the present invention can be applied to a PPM method of another order.

Figure 5:
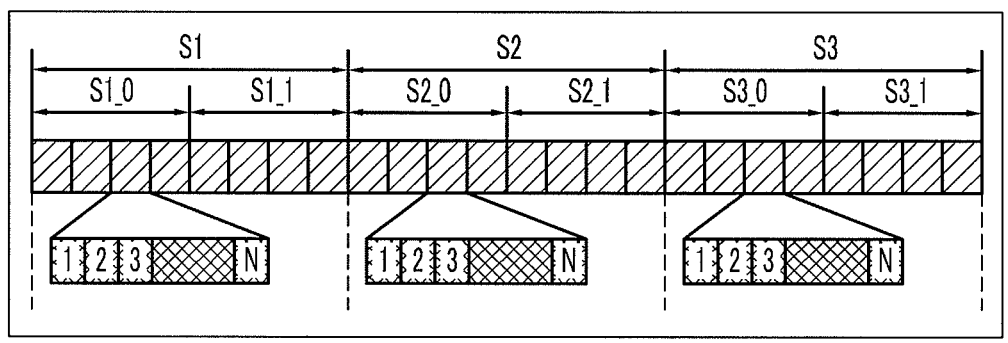
FIG. 5 shows a plurality of grouped symbol compositions according to an exemplary embodiment of the present invention.

FIG. 5 shows the plurality of grouped symbols according to the exemplary embodiment of the present invention, and shows the case of grouping three symbols by way of example. Further, FIG. 6 shows the number of cases of symbol compositions that can be represented by the plurality of grouped symbols according to the exemplary embodiment of the present invention.

Referring to FIG. 5, one symbol group includes three symbols S1, S2, and S3, and each symbol is divided into two pulse periods. In addition, each pulse period is divided into four hopping periods, and N pulses may be positioned in each hopping period. As such, when one symbol group includes three symbols, one symbol group is divided into 6 pulse periods in total.

The group PPM method according to the exemplary embodiment of the present invention performs the modulation or demodulation on the plurality of grouped symbols at one time rather than performing the modulation or demodulation on one symbol and then on a subsequent symbol. Meanwhile, in the case of the group PPM method, the number of pulse periods in which the pulses in one symbol group are positioned is three, like the case of using three symbols according to the 2PPM method of the related art.

Figure 6:
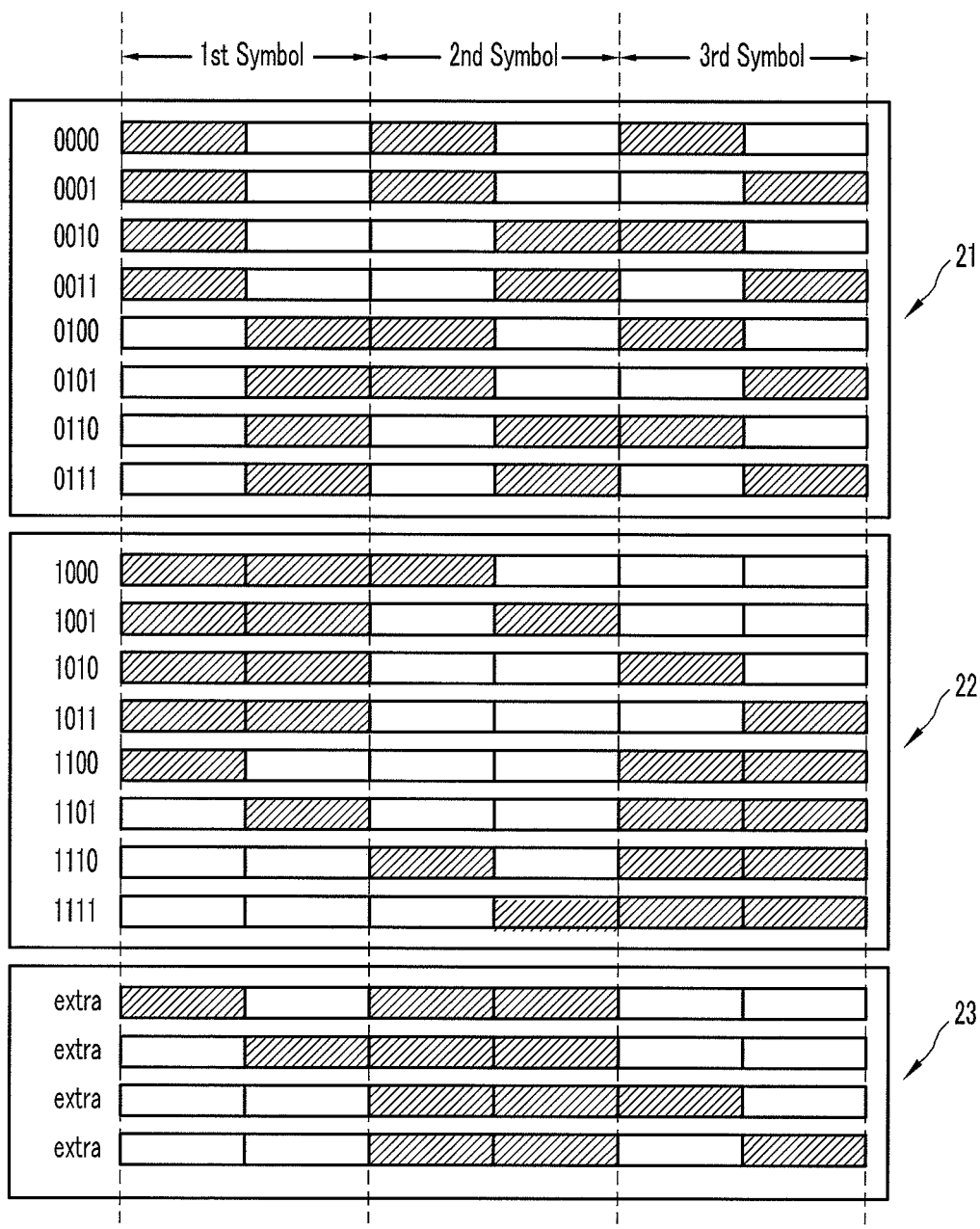
FIG. 6 shows the number of cases of symbol compositions that can be represented by the plurality of grouped symbols according an exemplary embodiment of the present invention.

Referring to FIG. 6, in the case of using the group PPM method, the number of cases of symbol compositions that can be composed of one symbol group, that is, the number of cases of representable data is 20 in total.

The symbol compositions corresponding to the number of cases included in a first symbol composition group 21 among the number of 20 cases represent the representable symbol compositions in the case of using three symbols according to the 2PPM method of the related art, and the symbol compositions included in a second symbol composition group 22 and a third symbol composition group 23 are added due to the group PPM method according to the exemplary embodiment of the present invention.

Referring to Table 1, as shown in FIG. 6, in the case of using the group PPM method, the number of cases that can be represented by one symbol group is 20 and the average amount of information is 4.3219. Therefore, a transmitter can transmit 4 bits of information at a maximum using three symbols.

The exemplary embodiment of the present invention groups the plurality of symbols into one symbol group, such that the symbol compositions are added in a manner that positions pulses in all the pulse periods included in one of the plurality of symbols included in the symbol group, unlike the manner of the related art that positions one pulse in one symbol. Meanwhile, 8 symbol compositions included in the second symbol composition group 22 among the added symbol compositions are composed to have a simple decision boundary to increase the reception probability of the receiver 200, and four symbol compositions included in the remaining third symbol composition group 23 can be used for the error detection, thereby making it possible to increase the error detection performance in the receiver.

Figure 7:
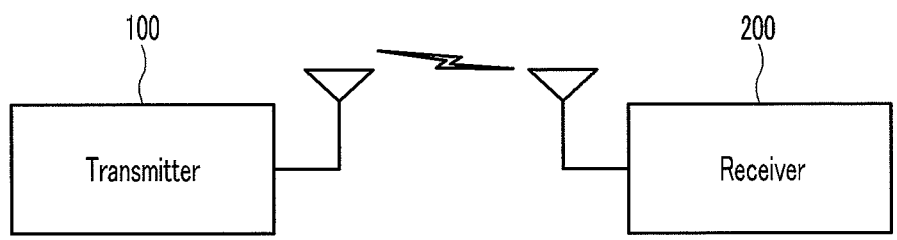
FIG. 7 is a schematic diagram showing a UWB system according to an exemplary embodiment of the present invention.

FIG. 7 is a schematic diagram showing an UWB system according to the exemplary embodiment of the present invention.

Referring to FIG. 7, the UWB system includes a transmitter 100 and a receiver 200 and the transmitter 100 modulates data using the group PPM method according to the exemplary embodiment of the present invention. Further, the receiver 200 receives data modulated by the group PPM method according to the exemplary embodiment of the present invention and demodulates them.

Figure 8:
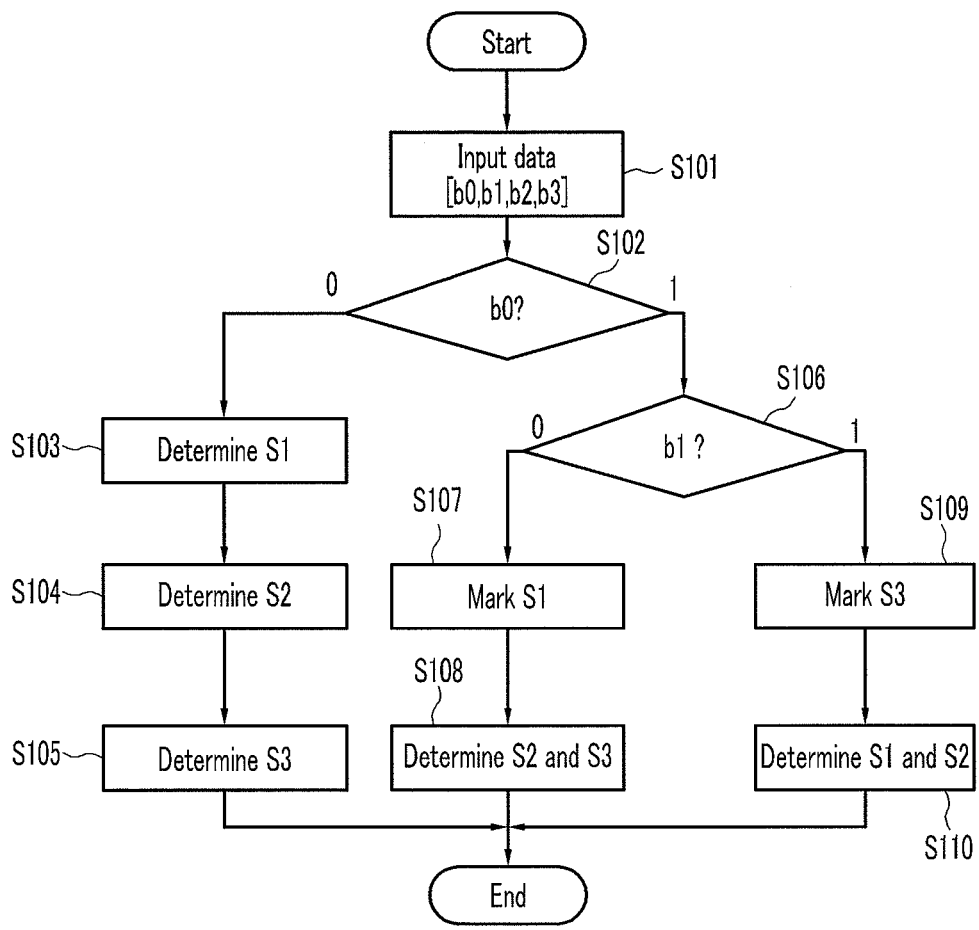
FIG. 8 is a flowchart showing a method for modulating data of a transmitter according to an exemplary embodiment of the present invention.

FIG. 8 is a flowchart showing a method for demodulating data by a transmitter according to the exemplary embodiment of the present invention and shows a method for modulating 4 bits of information using the group PPM method that groups three symbols.

Referring to FIG. 8, when the transmitter 100 receives data [b0, b1, b2, b3] to be transmitted (S101), it confirms a value of a first bit b0, which is input first, among 4 bits of data to be transmitted (S102). Herein, the first bit is determined by an input order of bits of the data, and may be a lowermost bit or an uppermost bit of the data.

When the first bit is 0, the transmitter 100 sequentially determines a first symbol S1, a second symbol S2, and a third symbol S3 according to values of a second bit b1, a third bit b2, and a fourth bit b3 (S103 to S105). In other words, as in the case of the first symbol composition group 21 of FIG. 6, the pulse position in the first symbol is determined according the value of the second bit like the PPM method of the related art, and the pulse positions in the second symbol and the third symbol are determined according to the values of the third bit and the fourth bit in the same manner.

On the other hand, when the first bit is 1, the transmitter 100 confirms the value of the second bit b1 (S106). Herein, the second bit means a bit input after the first bit.

When the second bit is 0, the transmitter 100 marks all the periods of the first symbol, that is, determines the first symbol composition, so that the pulses are positioned in all the periods of the first symbol (S107). Like the case of the second symbol composition group 22 of FIG. 6, the remaining second symbol and third symbol are determined based on the values of the third bit and fourth bit (S108). In other words, the second symbol and the third symbol are determined so that the pulses are positioned in one of the pulse periods included in the remaining second and third symbols according to the values of the third bit and fourth bit.

On the other hand, when the second bit is 1, the transmitter 100 marks all the periods of the final symbol, that is, the third symbol (S109). Like the case of the second group 22 of FIG. 6, the remaining first symbol and second symbol are determined based on the values of the third bit and fourth bit (S110). In other words, the first symbol and second symbol are determined so that the pulses are positioned in one of the pulse periods included in the remaining first bit and second bit according to the values of the third bit and fourth bit.

As described above, when the symbol mapping is completed, the transmitter 100 performs the modulation as defined by the following Equation 7 using the determined symbol. Herein, unlike the manner of the related art, the exemplary embodiment of the present invention performs the modulation in a manner of continuously modulating the grouped symbols.

$$x_k(t) = \sum_{l=1}^{N_{group}} \sum_{i=1}^{N_{burst}} S_j p(t - g_l T_{PPM} - jT_c - h_l T_{burst})$$ [Equation 7]

wherein, $N_{group}$ represents the number of grouped symbols. Also, $g_l$, which is a value for mapping the continuously input data, can be represented as in Table 2 according to the modulation symbol.

TABLE 2

Mapping table

| Input Bit | | | | Symbol Code | | | Mapping Code | | |
|---|---|---|---|---|---|---|---|---|---|
| b0 | b1 | b2 | b3 | S1 | S2 | S3 | g1 | g2 | g3 |
| 0 | 0 | 0 | 0 | 1 0 | 1 0 | 1 0 | 5 | 3 | 1 |
| 0 | 0 | 0 | 1 | 1 0 | 1 0 | 0 1 | 5 | 3 | 0 |
| 0 | 0 | 1 | 0 | 1 0 | 0 1 | 1 0 | 5 | 2 | 1 |
| 0 | 0 | 1 | 1 | 1 0 | 0 1 | 0 1 | 5 | 2 | 0 |
| 0 | 1 | 0 | 0 | 0 1 | 1 0 | 1 0 | 4 | 3 | 1 |
| 0 | 1 | 0 | 1 | 0 1 | 1 0 | 0 1 | 4 | 3 | 0 |
| 0 | 1 | 1 | 0 | 0 1 | 0 1 | 1 0 | 4 | 2 | 1 |
| 0 | 1 | 1 | 1 | 0 1 | 0 1 | 0 1 | 4 | 2 | 0 |
| 1 | 0 | 0 | 0 | 1 1 | 1 0 | 0 0 | 5 | 4 | 3 |
| 1 | 0 | 0 | 1 | 1 1 | 0 1 | 0 0 | 5 | 4 | 2 |
| 1 | 0 | 1 | 0 | 1 1 | 0 0 | 1 0 | 5 | 4 | 1 |
| 1 | 0 | 1 | 1 | 1 1 | 0 0 | 0 1 | 5 | 4 | 0 |
| 1 | 1 | 0 | 0 | 1 0 | 0 0 | 1 1 | 5 | 1 | 0 |
| 1 | 1 | 0 | 1 | 0 1 | 0 0 | 1 1 | 4 | 1 | 0 |
| 1 | 1 | 1 | 0 | 0 0 | 1 0 | 1 1 | 3 | 1 | 0 |
| 1 | 1 | 1 | 1 | 0 0 | 0 1 | 1 1 | 2 | 1 | 0 |

Meanwhile, although the exemplary embodiment of the present invention describes, by way of example, the case of determining the symbol compositions according to the bit values included in data to be transmitted, the present invention can use a method of previously generating the symbol mapping table that stores the symbol compositions for each data, and when data to be transmitted are input, reading, from the symbol mapping table, the symbol compositions that correspond to the data in question and using them.

Figure 9:
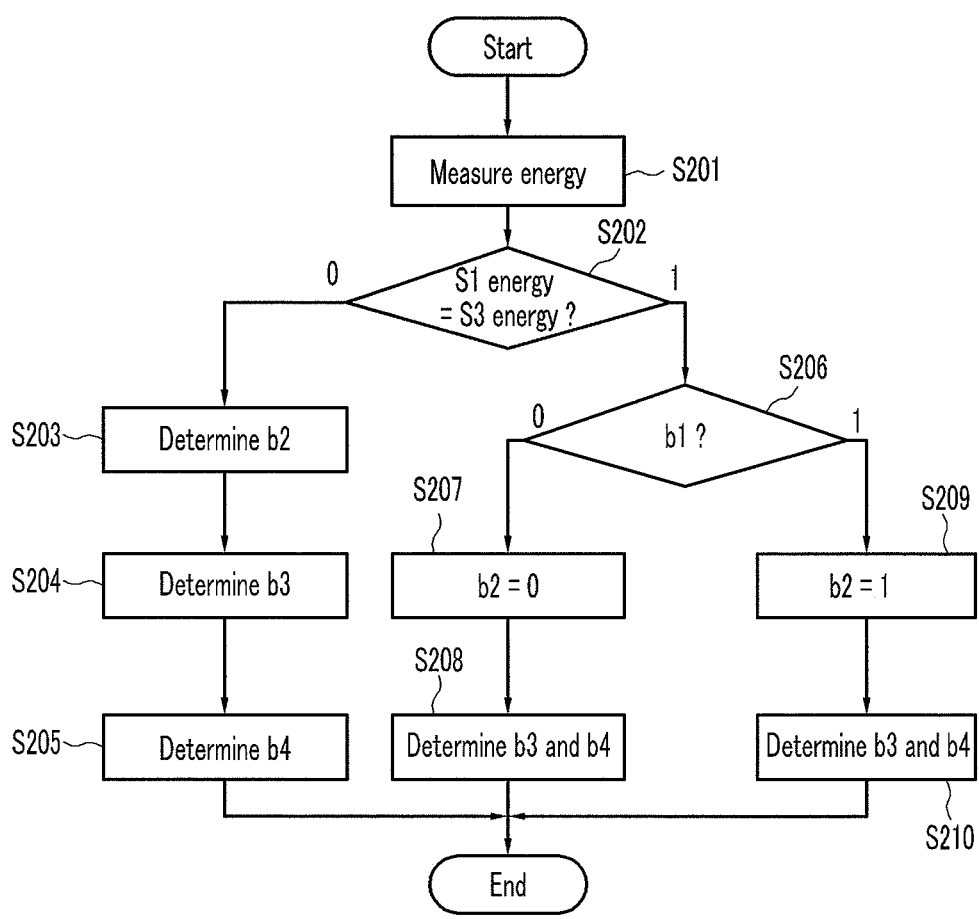
FIG. 9 is a flowchart showing a method for demodulating data of a receiver according to an exemplary embodiment of the present invention.

FIG. 9 is a flowchart showing a method for demodulating data by a receiver according to the exemplary embodiment of the present invention.

Referring to FIG. 9, when the receiver 200 receives the data frame including the signal modulated by the group PPM method from the transmitter 100, it measures the energy of each symbol included in the received data frame (S201). Also, it confirms whether the energy of the first symbol S1 is the same as the energy of the final symbol, that is, the third symbol S3 (S202). In the exemplary embodiment of the present invention, if the energy of both symbols has a difference of a threshold value or less, it is determined that the energy of both symbols is the same.

If it is determined that the energy of the first symbol and third symbol is the same, the receiver 200 determines the first bit b0 of data to be 0, the data being transmitted through the corresponding data frame. The values of the second bit b1, third bit b2, and fourth bit b3 are determined using the first symbol S1, the second symbol S2, and the third symbol S3 in the PPM method of the related art (S203 to S205). In other words, like the case of the first group 21 of FIG. 6, the value of the second bit is determined according to the pulse position in the first symbol in the PPM method of the related art, and the values of the third bit and fourth bit are determined according the pulse position in the second symbol and third symbol in the same manner.

On the other hand, when the energy of the first symbol and the third symbol are not the same, the receiver 200 confirms whether the energy of the first symbol has the greater threshold value than the energy of the third symbol (S206).

As the confirmation result, when the energy of the first symbol is larger than that of the third energy, the receiver 200 sets the second bit to 0 (S207). Like the case of the second symbol composition group 22 of FIG. 6, the values of the third bit and the fourth bit are determined based on the second symbol and the third symbol (S208). In other words, the values of the third bit and the fourth bit are determined according to whether the pulses are positioned in any period of the plurality of pulse periods included in the second symbol and the third symbol.

On the other hand, when the energy of the third symbol is larger than that of the first symbol, the receiver 200 determines the second bit to be 1 (S209). Also, like the case of the second symbol composition group 22 of FIG. 6, the values of the third bit and the fourth bit are determined according to the second symbol and the third symbol (S210). In other words, the values of the third bit and the fourth bit are determined according to the period in which the pulses are positioned among the plurality of pulse periods included in the second symbol and the third symbol.

Herein, when the energy of one symbol is 1, if the symbol is composed as in the second symbol composition group 22 of FIG. 6, the difference between the energy of the first symbol and the energy of the final symbol is very large, being from 1 to 2. Therefore, the exemplary embodiment of the present invention sets the threshold value and performs steps (S206 to S210) when the difference in energy between both symbols is larger than the threshold value.

The present invention does not increase the PPM order or reduce the length of the data frame, but groups the plurality of symbols to newly add the symbol compositions to the fixed symbols of the related art, thereby increasing the average amount of information and the data transmission rate.

Further, the present invention improves the data transmission rate while maintaining the length of the data frame and the PPM order of the related art, thereby maximizing the data transmission rate while having the same energy and the same error probability as the manners of the related art.

In addition, the present invention can use the symbol compositions not used in the modulation and demodulation process among the added symbol compositions as the error correction signal or the added control signal, making it possible to improve the system performance. In particular, the present invention does not additionally use the energy to improve the data transmission rate, such that it is suitable for a system that should satisfy a high data transmission rate at a low power without using additional energy.

The exemplary embodiments of the present invention as described above are implemented not only by the method and apparatus, but also by programs that achieve functions corresponding to the configuration of the exemplary embodiments of the present invention or recording mediums including the programs. This can be easily implemented from the foregoing exemplary embodiments by those skilled in the art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for modulating data using a pulse position modulation manner by a transmitter, comprising:
   reading symbol compositions mapped to input data from a symbol mapping table that includes symbol compositions represented by a plurality of grouped symbols; and
   modulating the data using the mapped symbol compositions,
   wherein the symbol mapping table includes
   a first symbol composition group including symbol compositions that are composed of a plurality of symbols having burst pulses positioned in all pulse periods,
      wherein the reading includes,
   when a first bit of the input data is a first value, reading symbol compositions corresponding to the values of the remaining bits other than the first bit of the input data bits among the symbol compositions included in the first symbol composition group as the mapped symbol compositions, and wherein
   the symbol mapping table further includes a second symbol composition group including the symbol compositions that are composed of a plurality of symbols having burst pulses positioned only in one pulse period for each symbol, and
   the reading further includes,
   when the first bit of the input data is a second value, reading symbol compositions corresponding to the values of remaining bits other than the first bit of the input data bits among the symbol compositions included in the second symbol composition group as the mapped symbol compositions.

2. The method for modulating data of claim 1, wherein
   the modulating includes simultaneously modulating the plurality of symbols included in the mapped symbol compositions.

3. A method for modulating data using a pulse position modulation manner by a transmitter, comprising:
   when a first bit of input data is a first value, determining pulse positions of each of a plurality of grouped symbols corresponding to each of the remaining bits other than the first bit of the input data bits;
   when the first bit is a second value different from the first value, positioning burst pulses in all the pulse periods of one of a first symbol and a second symbol among the plurality of grouped symbols according to the value of the second bit of the input data; and determining pulse positions of the remaining symbols other than the symbols having the burst pulses in all the pulse periods among the plurality of grouped symbols according to the values of the remaining bits other than the first bit and the second bit of the input data bits, wherein the determining the pulse positions of each of the plurality of grouped symbols includes positioning the burst pulses in one of the pulse periods of the corresponding symbol of the plurality of grouped symbols according to each value of the remaining bits, and wherein the determining includes, when the second bit is the first value, positioning the burst pulses in all the pulse periods of the first symbol and positioning the burst pulses in one of the plurality of pulse periods included in the remaining symbols other than the first symbol among the plurality of grouped symbols according to the values of the remaining bits other than the first bit and the second bit of the input data bits.

4. The method for modulating data of claim 3, wherein the first symbol is one of the first symbol and the final symbol of the plurality of symbols.

5. The method for modulating data of claim 3, wherein the pulse positions of the remaining symbols are determined based on 4PPM method.

6. A method for demodulating data modulated using a pulse position modulation method by a receiver, comprising:
measuring energy of a plurality of input symbols;
determining a value of a first bit according to whether the energy of a first symbol and a second symbol of the plurality of symbols is the same;
when the value of the first bit is determined to be a first value, determining the values of the remaining bits other than the first bit according to pulse positions of each of the plurality of symbols;
when the value of the first bit is determined to be a second value different from the first value, determining a value of a second bit by comparing the energy of the first symbol and the second symbol; and
when the value of the second bit is determined, determining the values of the remaining bits other than the first bit and the second bit according to the pulse positions of the remaining symbols other than the first symbol if the first symbol has a larger energy than the second symbol, or other than the second symbol if the second symbol has a larger energy than the first symbol.

7. The method for demodulating data of claim 6, wherein the determining the value of the first bit includes determining whether the energy of the first symbol and the second symbol is the same, wherein whether the energy of the first symbol and the second symbol is the same is based on whether the difference in energy between the first symbol and the second symbol Is equal to or less than a threshold value.

8. The method for demodulating data of claim 7, wherein the determining the values of the remaining bits other than the first bit includes determining the values of the corresponding bits according to a pulse period where burst pulses are positioned among pulse periods included in each of the plurality of symbols.

9. The method for demodulating data of claim 7, wherein the determining the value of the second bit includes, when the energy of the first symbol has a greater threshold value than the energy of the second symbol, determining the value of the second bit to be the first value, and when the energy of the second symbol has a greater threshold value than the energy of the first symbol, determining the value of the second bit to be the second value.

10. The method for demodulating data of claim 9, wherein the determining the values of the remaining bits other than the first bit and the second bit includes, when the energy of the first symbol has a larger threshold value than the energy of the second symbol, determining the values of the remaining bits other than the first bit and the second bit according to the pulse period where the burst pulses are positioned among the pulse periods included in the remaining symbols other than the first symbol of the plurality of symbols.

* * * * *